US010170184B1

United States Patent
Wang et al.

(10) Patent No.: US 10,170,184 B1
(45) Date of Patent: Jan. 1, 2019

(54) RESISTIVE MEMORY APPARATUS AND SETTING METHOD FOR RESISTIVE MEMORY CELL THEREOF

(71) Applicant: Winbond Electronics Corp., Taichung (TW)

(72) Inventors: Ping-Kun Wang, Taichung (TW);
Shao-Ching Liao, Taichung (TW);
Ming-Che Lin, Taichung (TW);
Min-Chih Wei, Taichung (TW);
Chia-Hua Ho, Taichung (TW);
Chien-Min Wu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/729,676

(22) Filed: Oct. 11, 2017

(30) Foreign Application Priority Data

Jul. 3, 2017 (CN) .......................... 2017 1 0532576

(51) Int. Cl.
*G11C 13/00* (2006.01)

(52) U.S. Cl.
CPC .......... *G11C 13/0097* (2013.01); *G11C 13/00* (2013.01); *G11C 13/0064* (2013.01); *G11C 13/0035* (2013.01)

(58) Field of Classification Search
CPC ..... G11C 16/0483; G11C 7/062; G11C 16/26; G11C 11/5614; G11C 11/5628;

(Continued)

(56) References Cited

U.S. PATENT DOCUMENTS 8,031,517 B2 10/2011 Kim et al.
8,804,401 B2 8/2014 Sugimae et al.
(Continued)

FOREIGN PATENT DOCUMENTS

TW I449050 8/2014
TW I530950 4/2016

OTHER PUBLICATIONS

Chen Wang et al., "Suppression of relaxation effect in HfO2 resistive random access memory array by improved program operations," Applied Physics Express, 9, 051501, Apr. 2016, pp. 051501-1-051501-4.

(Continued)

*Primary Examiner* — Thong Q Le
(74) *Attorney, Agent, or Firm* — JCIPRNET (57) ABSTRACT

A resistive memory apparatus and a setting method for a resistive memory cell thereof are provided. The setting method includes: performing a first setting operation on the resistive memory cell, and performing a first verifying operation on the resistive memory cell after the first setting operation is finished; determining whether to perform a first resetting operation on the resistive memory cell according to a verifying result of the first verifying operation, and performing a second verifying operation on the resistive memory cell after the first resetting operation is determined to be performed and is finished; and determining whether to perform a second resetting operation on the resistive memory cell according to a verifying result of the second verifying operation, and performing a third verifying operation on the resistive memory cell after the second resetting operation is determined to be performed and is finished.

15 Claims, 6 Drawing Sheets

(58) Field of Classification Search
CPC .............. G11C 13/0011; G11C 13/004; G11C 13/0064; G11C 16/08; G11C 16/10; G11C 16/30
USPC .... 365/185.18, 185.03, 185.21, 185.22, 148, 365/185.17, 185.29, 189.05, 189.08, 365/189.12, 189.17, 230.01
See application file for complete search history.

(56) References Cited

U.S. PATENT DOCUMENTS

| | | |
|---|---|---|
| 9,443,587 B1 | 9/2016 | Chen et al. |
| 2015/0070972 A1* | 3/2015 | Kitagawa ............. G11C 13/004 365/148 |
| 2016/0064664 A1 | 3/2016 | Dang et al. |

OTHER PUBLICATIONS

"Office Action of Taiwan Counterpart Application", dated Feb. 22, 2018, p. 1-p. 9, in which the listed references were cited.

* cited by examiner

RESISTIVE MEMORY APPARATUS AND SETTING METHOD FOR RESISTIVE MEMORY CELL THEREOF

CROSS-REFERENCE TO RELATED APPLICATION

This application claims the priority benefit of China application serial no. 201710532576.6, filed on Jul. 3, 2017. The entirety of the above-mentioned patent application is hereby incorporated by reference herein and made a part of this specification.

BACKGROUND OF THE INVENTION

1. Field of the Invention

The invention relates to a resistive memory apparatus and a setting method for a resistive memory cell thereof, and more particularly, to a resistive memory apparatus and a setting method for a resistive memory cell thereof which are capable of preventing high temperature data retention loss.

2. Description of Related Art

In resistive memories, to recover an oxygen vacancy region of a resistive memory cell generated in a setting operation and improve its switching stability, a setting mechanism which utilizes a resetting operation performed unconditionally after setting has been proposed in the conventional art. However, this kind of conventional setting mechanism performs the setting and resetting operations unconditionally on all the resistive memory cells been through the setting operation. Accordingly, two possible issues in the conventional art are likely to occur, as shown in FIG. 1A and FIG. 1B.

Figure 1A:
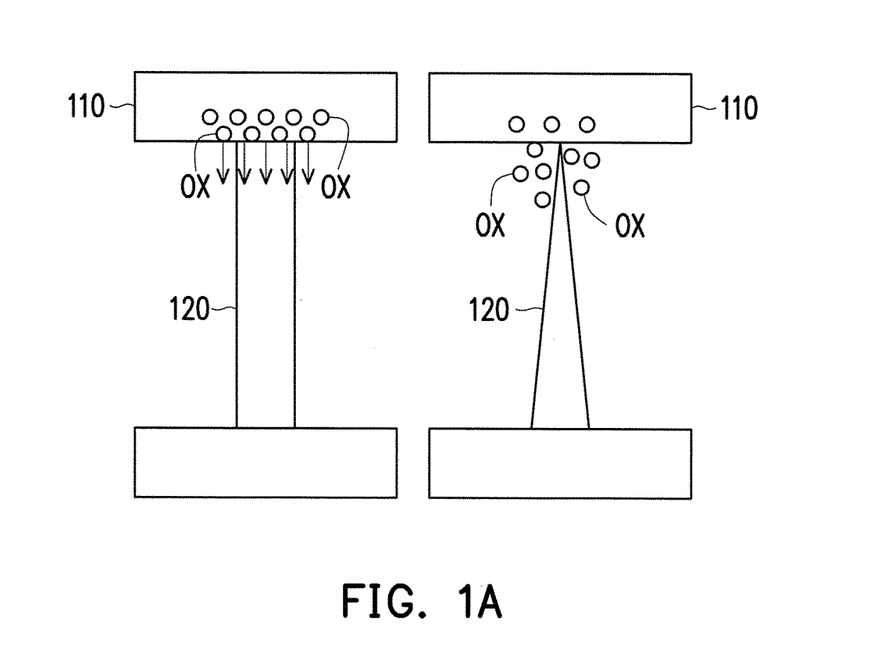
FIG. 1A and FIG. 1B illustrate the two possible issues likely to occur during the setting operation in the conventional art.

In FIG. 1A, for the normal resistive memory cells, if the resetting operation is too strong, massive oxygen ions OX in a titanium layer 110 may be forced into an oxygen vacancy region 120, and thus a contact area of the oxygen vacancy region 120 and the titanium layer 110 may be narrowed through a recombination action between the oxygen vacancy region 120 and the oxygen ions OX thereby causing the problem of high temperature data retention loss.

Figure 1B:
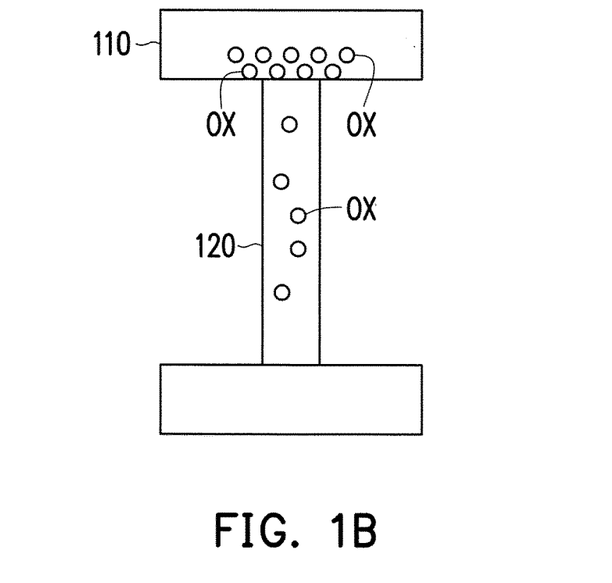

In FIG. 1B, if the resetting operation is too weak, the oxygen ions OX may be pushed away from the oxygen vacancy region 120, and thus the oxygen vacancy region 120 may be weaken through the recombination action between the oxygen vacancy region 120 and the oxygen ions OX, which also leads to the problem of high temperature data retention loss.

SUMMARY OF THE INVENTION

The invention is directed to various resistive memory apparatuses and their setting methods for resistive memory cell, which are capable of effectively solving the problem of high temperature data retention loss.

A setting method for the resistive memory cell of the invention includes: performing a first setting operation on the resistive memory cell, and performing a first verifying operation on the resistive memory cell after the first setting operation is finished; determining whether to perform a first resetting operation on the resistive memory cell according to a verifying result of the first verifying operation, and performing a second verifying operation on the resistive memory cell after the first resetting operation is determined to be performed and is finished; and determining whether to perform a second resetting operation on the resistive memory cell according to a verifying result of the second verifying operation, and performing a third verifying operation on the resistive memory cell after the second resetting operation is determined to be performed and is finished.

Another setting method for the resistive memory cell of the invention includes: performing a first setting operation on the resistive memory cell, and performing a first verifying operation on the resistive memory cell after the first setting operation is finished; determining whether to perform a second setting operation on the resistive memory cell according to a verifying result of the first verifying operation, and performing a second verifying operation on the resistive memory cell after the second setting operation is determined to be performed and is finished; determining whether to perform a first resetting operation on the resistive memory cell according to a verifying result of the second verifying operation, and performing a third verifying operation on the resistive memory cell after the first resetting operation is determined to be performed and is finished; determining whether to perform a second resetting operation on the resistive memory cell according to a verifying result of the third verifying operation, and performing a fourth verifying operation on the resistive memory cell after the second resetting operation is determined to be performed and is finished; and determining whether to perform a third resetting operation on the resistive memory cell according to a verifying result of the fourth verifying operation.

A resistive memory apparatus of the invention includes a plurality of resistive memory cells, a controller and a current verifier. The resistive memory cells are coupled to a source line and a bit line. The controller is coupled to the source line and the bit line. The current verifier is coupled to the bit line. Among them, the controller is configured to execute the steps in aforementioned setting methods for the resistive memory cell.

Based on the above, according to the setting methods for the resistive memory cell, the verifying operation is performed after the setting operation is performed on the resistive memory cell, and whether the subsequent resetting operations is to be performed is determined according to the verifying result of the verifying operation. Accordingly, when performing the setting method for the resistive memory cells with different characteristics, the invention can conduct an adaptive adjustment on setting actions with respect to the characteristic of the selected resistive memory cell. As a result, the probability of high temperature data retention loss occurred on the resistive memory cells may be effectively reduced to maintain the yield of the resistive memory apparatus.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 2:
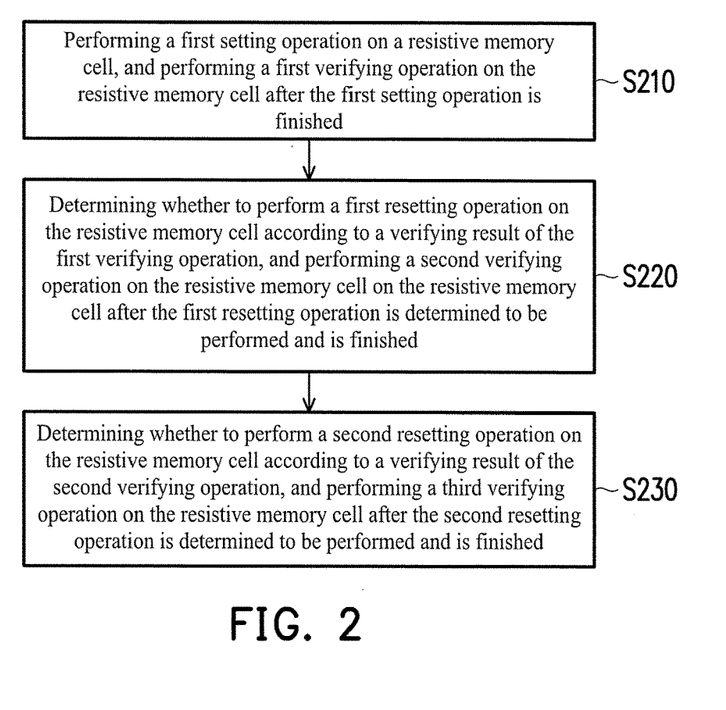
FIG. 2 is a flowchart illustrating a setting method for a resistive memory cell according to an embodiment of the invention.

With reference to FIG. 2, FIG. 2 is a flowchart illustrating a setting method for a resistive memory cell according to an embodiment of the invention. In the drawing, when a setting operation is to be performed on the resistive memory cell, first of all, by executing step S210, a first setting operation is performed on the resistive memory cell, and a first verifying operation is performed on the resistive memory cell after the first setting operation is finished; then, after the first verifying operation is finished, by executing step S220, whether to perform a first resetting operation on the resistive memory cell is determined according to a verifying result of the first verifying operation, and a second verifying operation on the resistive memory cell is performed on the resistive memory cell after the first resetting operation is determined to be performed and is finished. Next, in step S230, whether to perform a second resetting operation on the resistive memory cell is determined according to a verifying result of the second verifying operation, and a third verifying operation is performed on the resistive memory cell after the second resetting operation is determined to be performed and is finished.

Based on the description above, it can be known that, in the setting method for the resistive memory cell according to the embodiments of the invention, after the first setting operation is finished for the resistive memory cell, the first resetting operation will not be performed on the resistive memory cell unconditionally. Instead, in the embodiments of the invention, the first verifying operation is first performed on the resistive memory cell with the setting operation finished for the first time, and whether to perform the first resetting operation on the resistive memory cell is determined according to the verifying result generated by the first verifying operation. Specifically, the first verifying operation can verify a resistance of the resistive memory cell with the setting operation finished for the first time. Further, when the first verifying operation verifies that the resistance of the resistive memory cell is set to less than a predetermined threshold, it means that the setting operation of such resistive memory cell is completed, and thus it is not required to perform the subsequent first resetting operation. On the other hand, if the first verifying operation verifies that the resistance of the resistive memory cell is set to not less than the predetermined threshold, it means that the setting operation of such resistive memory cell is not yet completed, and thus it is required to perform the subsequent first resetting operation. Also, in the embodiments of the invention, the second verifying operation is performed after the first resetting operation is finished, so as to determine whether to further perform the second resetting operation.

With regard to action details, when the first setting operation is performed on the resistive memory cell, a first setting voltage may be provided to connect across two ends of the resistive memory cell and thereby lower the resistance of the resistive memory cell. Then, the verifying operation is performed on the resistive memory cell. When the first verifying operation is performed on the resistive memory cell, a verifying voltage is provided to connect across the two ends of the resistive memory cell, a verifying current generated by the resistive memory cell according to the verifying voltage is measured, and a current value of the verifying current is compared with a predetermined value. When the current value of the verifying current is greater than the predetermined value, it means that the setting actions of the resistive memory cell are completed. Otherwise, when the current value of the verifying current is not greater than the predetermined value, it means that the setting actions of the resistive memory cell are not yet completed.

When the verifying result of the first verifying operation indicates that the setting actions of the resistive memory cell are not yet completed, a first resetting voltage may be provided to the two ends of the resistive memory cell, and the first resetting operation may be performed on the resistive memory cell. When the verifying result of the second verifying operation indicates that the setting actions of the resistive memory cell are not yet completed, the second resetting operation may be performed on the resistive memory cell once again to perform the setting operation on the resistive memory cell.

Figure 3:
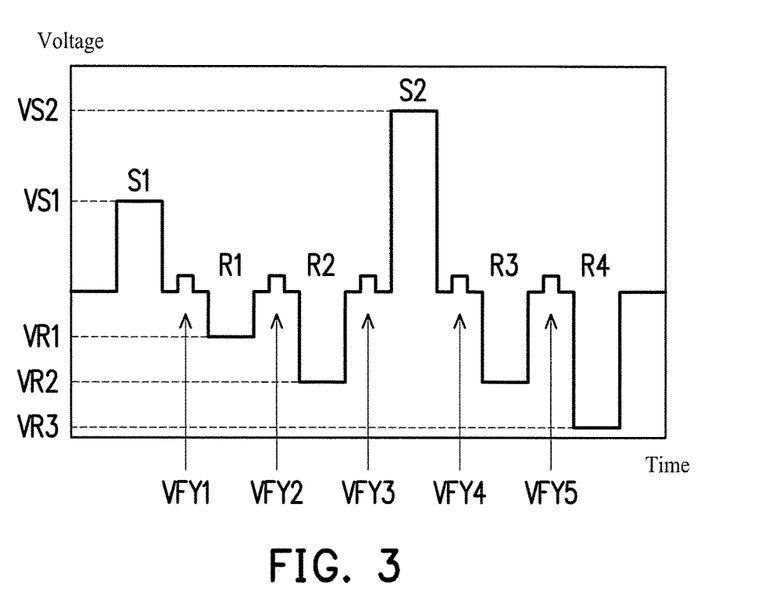
FIG. 3 is a schematic diagram illustrating waveforms in setting actions for the resistive memory cell according to an embodiment of the invention.

With reference to FIG. 3, FIG. 3 is a schematic diagram illustrating waveforms in the setting actions for the resistive memory cell according to an embodiment of the invention. In the drawing, in a stage S1, a setting voltage VS1 is provided to connect across two ends of the resistive memory cell and a setting operation is performed. Next, a verifying operation VFY1 is performed on the resistive memory cell after the setting operation is finished (after the stage S1). Then, if a verifying result of the verifying operation VFY1 indicates that the setting actions of the resistive memory cell are not yet completed, in a stage R1, a resetting voltage VR1 is provided to connect across the two ends of the resistive memory cell and a resetting operation is performed. It should be noted that, polarities of the resetting voltage VR1 and the setting voltage VS1 are opposite, and a voltage absolute value of the resetting voltage VR1 is less than a voltage absolute value of the setting voltage VS1.

On the other hand, in the embodiments of the invention, after the resetting operation is finished (after the stage R1), a verifying operation VFY2 is performed on the resistive memory cell once again, so as to verify whether the setting actions of the resistive memory cell are completed. If it is verified that the setting actions of the resistive memory cell are completed, the setting actions of such resistive memory cell may be stopped. Otherwise, if it is verified that the setting actions of the relative are not yet completed, the resetting operation may be performed on the resistive memory cell once again in a stage R2, and a verifying operation VFY3 may be performed after the stage R2. Among them, a voltage absolute value of the resetting voltage VR2 applied in the stage R2 may be greater than the voltage absolute value of the resetting voltage VR1 applied in the stage R1.

If the verifying result of the verifying operation VFY3 still indicates that the setting actions of the resistive memory cell are not yet completed, in the embodiments of the invention, a setting voltage VS2 may be provided to connect across the two ends of the resistive memory cell in a stage S2 and thereby perform the setting operation once again. Here, a voltage value of the setting voltage VS2 is greater than a voltage value of the setting voltage VS1. Also, after the setting operation is finished (after the stage S2), a verifying operation VFY4 is performed on the resistive memory cell.

In addition, cyclic actions including the resetting operation and the verifying operation may be performed on the resistive memory cell for one or multiple times after the verifying operation VFY4, so as to complete the setting actions of the resistive memory cell. In FIG. 3, stages R3 and R4 perform resetting operations of different degrees, respectively. The voltage absolute value of the resetting voltage VR2 provided by the resetting operation of the stage R3 is less than a voltage absolute value of a resetting voltage VR3 provided by the resetting operation of the stage R4, and verifying operations VFY4 and VFY5 are performed immediately after the stages R3 and R4, respectively. Among them, the voltage absolute value of the resetting voltage VR2 applied in the stage R2 may be less than a voltage absolute value of the resetting voltage VR3 applied in the stage R4.

It is noted that, the verifying operations VFY1 to VFY5 in the embodiments of the invention may be performed by providing positive or negative verifying voltages to the resistive memory cell and reading a read current generated by the resistive memory cell.

Figure 4:
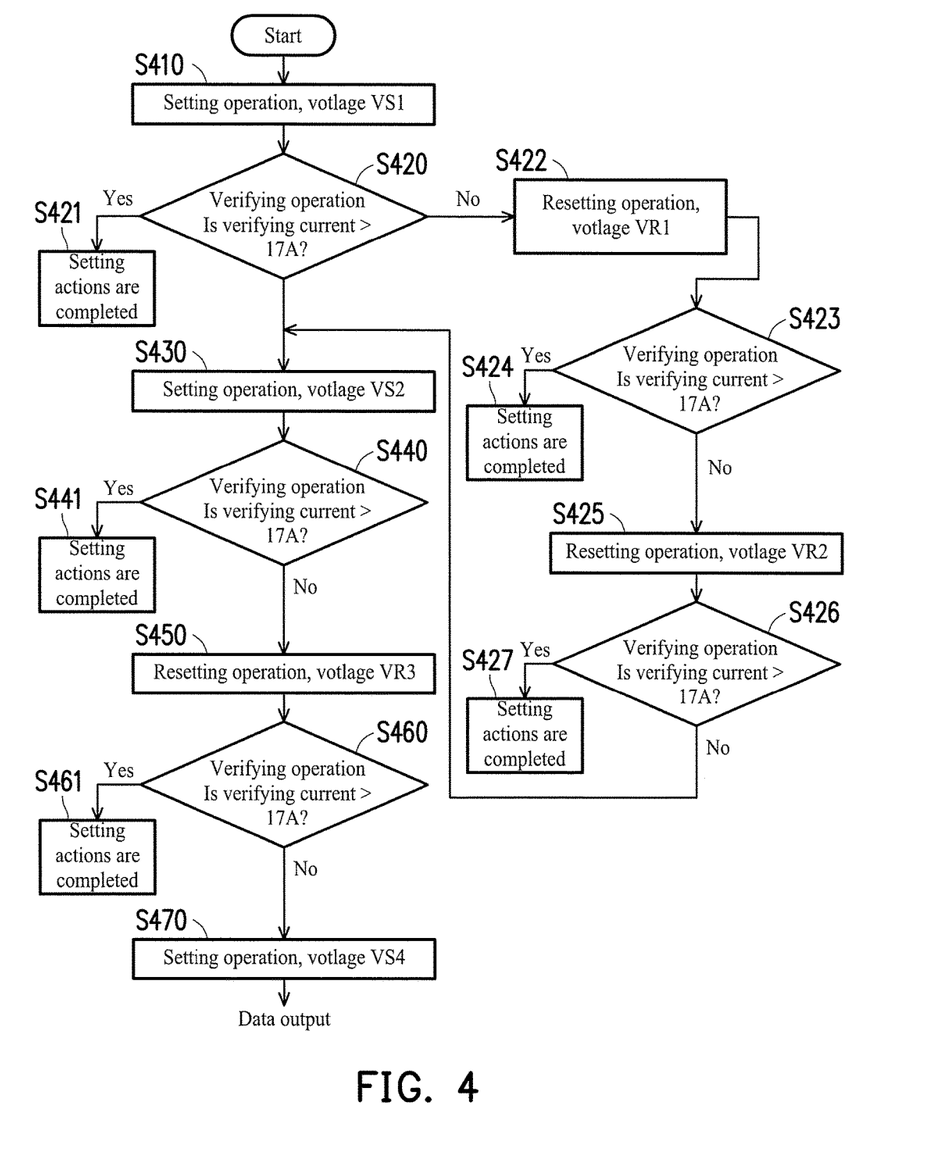
FIG. 4 is a flowchart illustrating a setting method for a resistive memory cell according to another embodiment of the invention.

With reference to FIG. 4, FIG. 4 is a flowchart illustrating a setting method for a resistive memory cell according to another embodiment of the invention. In step S410, a setting voltage with a voltage absolute value, for example, between 4.5V and 1.5V is provided to the resistive memory cell to thereby perform a setting operation. Next, in step S420, a verifying operation is performed, and whether a verifying current generated by the resistive memory cell according to a verifying voltage is greater than a predetermined value (e.g., 17 uA) is determined. If the verifying current is greater than 17 uA, it means that the setting actions are completed (step S421). Otherwise, if the verifying current is not greater than 17 uA, step S422 is executed.

In step S422, a resetting voltage VR1 with a voltage absolute value (e.g., between 3.6V and 0.6V) is provided to the resistive memory cell to thereby perform a resetting operation. Next, in step S423, a verifying operation is performed on the resistive memory cell, and whether a verifying current is greater than the predetermined value (e.g., 17 uA) is determined. If the verifying current is greater than 17 uA, it means that the setting actions are completed (step S424). Otherwise, if the verifying current is not greater than 17 uA, step S425 is executed.

In step S425, a resetting voltage VR2 (greater than the resetting voltage VR1) with a higher voltage absolute value (e.g., between 3.8V and 0.8V) is provided so as to perform a resetting operation once again. Then, in subsequent step S426, a verifying operation is performed on the resistive memory cell and whether a verifying current is greater than the predetermined value (e.g., 17 uA) is determined. If the verifying current is greater than 17 uA, it means that the setting actions are completed (step S427). Otherwise, if the verifying current is not greater than 17 uA, step S430 is executed.

In step S430, a setting operation is performed on the resistive memory cell once again. In step S430, the setting operation is performed on the resistive memory cell by providing a setting voltage VS2 with a voltage absolute value, for example, between 5.0V and 2.0V. It is noted that, the voltage absolute value of the setting voltage VS2 in step S430 is greater than the voltage absolute value of the setting voltage VS1 in step S410.

In step S440 subsequent to step S440, a verifying operation is performed on the resistive memory cell, and whether a verifying current is greater than the predetermined value (e.g., 17 uA) is determined. If the verifying current is greater than 17 uA, it means that the setting actions are completed (step S441). Otherwise, if the verifying current is not greater than 17 uA, step S450 is executed.

In step S450, a resetting operation is performed on the resistive memory cell by providing a resetting voltage VR3 with a voltage absolute value, for example, between 3.8V and 0.8V. Next, in step S460, a verifying operation is performed on the resistive memory cell, and whether a verifying current is greater than the predetermined value (e.g., 17 uA) is determined. If the verifying current is greater than 17 uA, it means that the setting actions are completed (step S461). Otherwise, if the verifying current is not greater than 17 uA, step S470 is executed.

In step S470, a resetting operation is performed on the resistive memory cell by providing a resetting voltage VR4 with a voltage absolute value, for example, between 4.0 and 1.0V and a data output is performed after the resetting operation is finished. Herein, the voltage absolute value of the resetting voltage VR4 provided in step S470 may be greater than the voltage absolute value of the resetting voltage VR3 provided in step S450. Also, actions of the data output may be performed after the step S470 is completed.

Value sizes regarding the setting voltages VS1 and VS2, the resetting voltages VR1 to VR4 and the verifying current may be properly adjusted according to actual electrical property of the resistive memory cell, and the values proposed in the embodiments of the invention are merely exemplary examples instead of limitations to the scope of the invention.

Figure 5A:
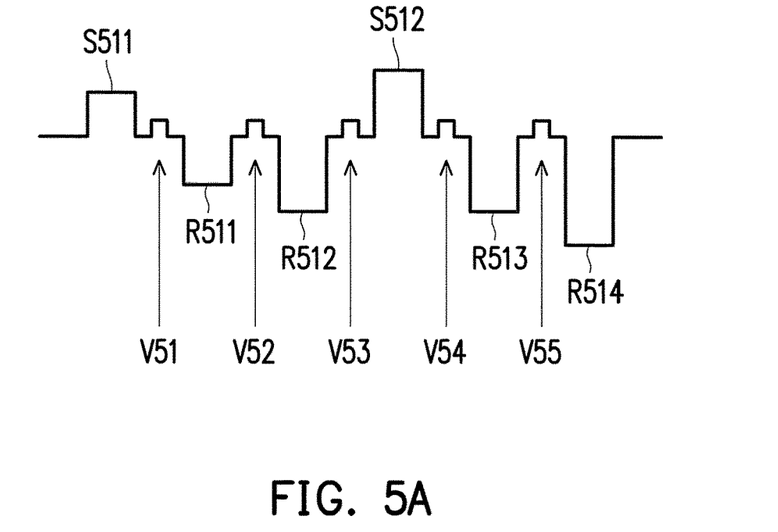
FIG. 5A to FIG. 5C are schematic diagrams illustrating various implementations of the setting method for the resistive memory cell according to the embodiments of the invention.
Figure 5B:
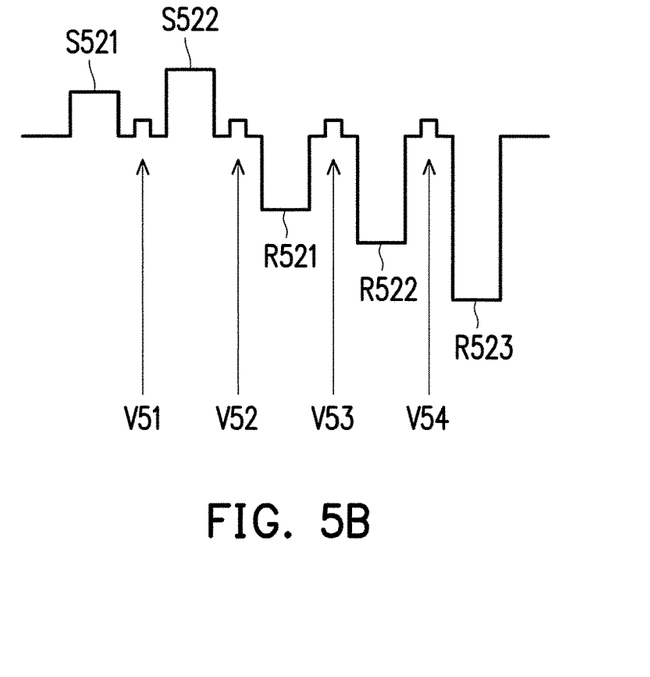
Figure 5C:
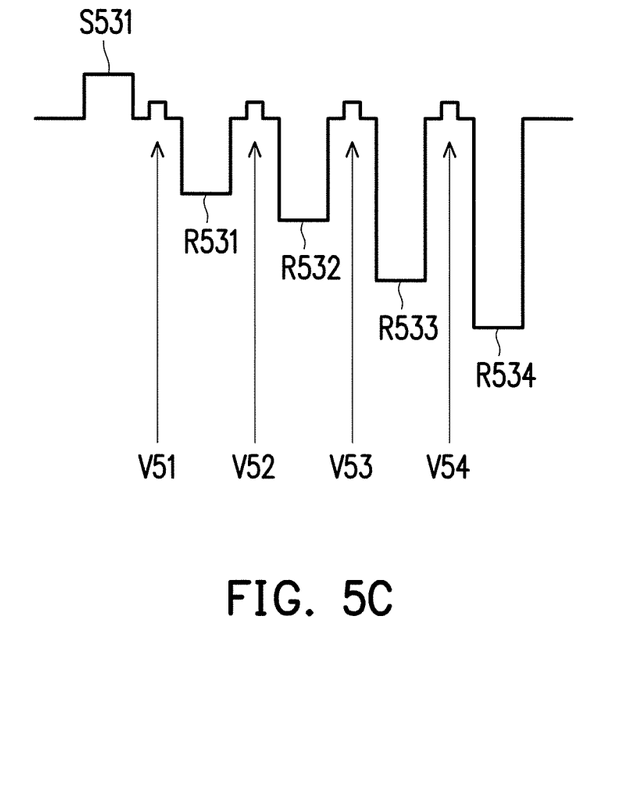

With reference to FIG. 5A to FIG. 5C, FIG. 5A to FIG. 5C are schematic diagrams illustrating various implementations of the setting method for the resistive memory cell according to the embodiments of the invention. In FIG. 5A, a plurality of resetting operations R511 and R512 may be continually performed after a setting operation S511. After the resetting operations R511 and R512, a setting operation S512 may be performed on the resistive memory cell once again, and a plurality of resetting operations R513 and R514 may be performed after the setting operation S512. Naturally, it is required to perform verifying operations V51 to V55, respectively, after the respective one of the setting operations S511 and S512 and the resetting operations R511 to R514, and determine whether subsequent operations need to be performed according to the verifying results of the verifying operations V51 to V55.

It should be noted that, in FIG. 5A, absolute values of the setting voltages of the setting operations S511 and S512 performed in sequence may be raised in sequence. Similarly, absolute values of the resetting voltages of the resetting operations R511 to S514 performed in sequence may also be raised in sequence.

Further, in FIG. 5B, setting operations S521 and S522 may first be performed on the resistive memory cell multiple times before performing resetting operations R521 to R524 on the resistive memory cell multiple times. Absolute values of setting voltages of the setting operations S521 and S522 performed in sequence may be raised in sequence. Similarly, absolute values of resetting voltages of the resetting operations R521 to R523 performed in sequence may also be raised in sequence. Naturally, it is required to perform verifying operations V51 to V54, respectively, after the respective one of the setting operations S521 and S522 and the resetting operations R521 to R523, and determine whether subsequent operations need to be performed according to the verifying results of the verifying operations V51 to V54.

In FIG. 5C, a setting operation S531 may be performed on the resistive memory cell for only one time before performing resetting operations R531 to R534 on the resistive memory cell multiple times. In the drawing, absolute values of resetting voltages of the resetting operations R521 to S523 performed in sequence may be raised in sequence. Further, it is required to perform verifying operations V51 to V54, respectively, after the respective one of the setting operation S531 and the resetting operations R531 to R534, and determine whether subsequent operations need to be performed according to the verifying results of the verifying operations V51 to V54.

Figure 6:
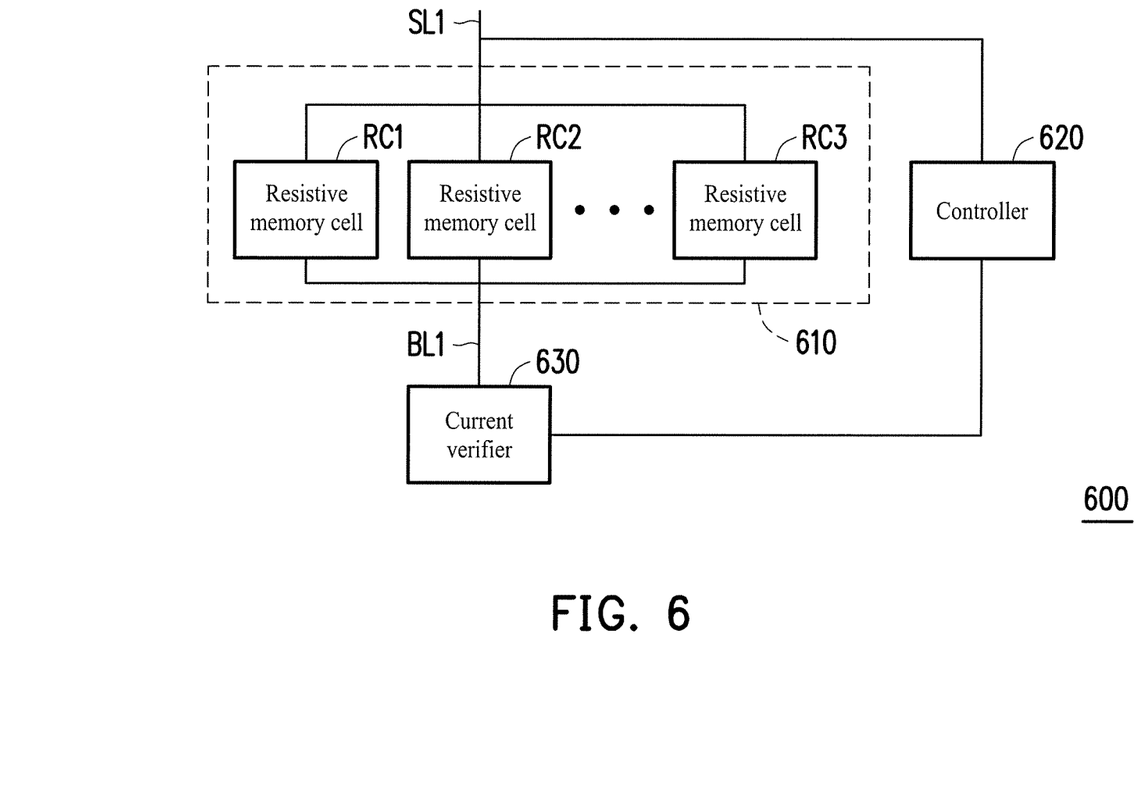
FIG. 6 is a schematic diagram illustrating a resistive memory apparatus according to an embodiment of the invention.

With reference to FIG. 6, FIG. 6 is a schematic diagram illustrating a resistive memory apparatus according to an embodiment of the invention. A resistive memory apparatus 600 includes resistive memory cells RC1 to RC3, a controller 620 and a current verifier 630. The resistive memory cells RC1 to RC3 can form a memory cell block 610 and can be coupled to a source line SL1 and a bit line BL1. The controller 620 is coupled to the source line SL1 and the bit line BL1. The current verifier 630 is coupled to the bit line BL1. Among them, the controller 620 can select one or more selected resistive memory cells from the resistive memory cells RC1 to RC3 through an address decoding action, and perform a setting operation, a resetting operation or a verifying operation by providing a setting voltage, a resetting voltage or a verifying voltage, respectively, to the selected resistive memory cell. When performing the setting operation, the controller 620 can provide the setting voltage to connect across the source line SL1 and the bit line BL1 so as to set the selected resistive memory cell. When performing the resetting operation, the controller 620 can provide the resetting voltage to connect across the source line SL1 and the bit line BL1 so as to reset the selected resistive memory cell. A polarity of the resetting voltage and a polarity of the setting voltage may be opposite. When performing the verifying operation, the controller 620 can provide the verifying voltage onto the source line, and the current verifier 630 can obtain a verifying current generated by the selected resistive memory cell according to the verifying voltage through the bit line BL1. The current verifier 630 determines whether the setting actions of the selected resistive memory cell are completed by comparing a current value of the verifying current with a predetermined value, and determining whether the current value of the verifying current is greater than the predetermined value.

Implementation details regarding the controller 620 and the current verifier 630 have been explained comprehensively in the foregoing embodiments, which are not repeated hereinafter.

To sum up, according to the setting actions of the resistive memory cell provided by the invention, the verifying operation is added after the setting operation, and whether to perform the resetting operation on the resistive memory cell is determined according to the verifying result. In this way, the setting actions with different processes may be performed for the resistive memory cells with different characteristics so as to reduce the probability of high temperature data retention loss occurred on the resistive memory cells.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A setting method for a resistive memory cell, comprising:
    performing a first setting operation on the resistive memory cell, and performing a first verifying operation on the resistive memory cell after the first setting operation is finished;
    after the first verifying operation is finished, determining whether to perform a first resetting operation on the resistive memory cell according to a verifying result of the first verifying operation, and performing a second verifying operation on the resistive memory cell after the first resetting operation is determined to be performed and is finished; and
    after the second verifying operation is finished, determining whether to perform a second resetting operation on the resistive memory cell according to a verifying result of the second verifying operation, and performing a third verifying operation on the resistive memory cell after the second resetting operation is determined to be performed and is finished.

2. The setting method for the resistive memory cell of claim 1, further comprising:
    determining whether to perform a second setting operation on the resistive memory cell according to a verifying result of the third verifying operation, and performing a fourth verifying operation on the resistive memory cell after the second setting operation is determined to be performed and is finished.

3. The setting method for the resistive memory cell of claim 2, wherein the step of performing the second setting operation on the resistive memory cell comprises:
    providing a second setting voltage to connect across two ends of the resistive memory cell, and performing the second setting operation on the resistive memory cell, wherein a voltage value of the second setting voltage is greater than a voltage value of a first setting voltage.

4. The setting method for the resistive memory cell of claim 1, wherein the step of performing the first verifying operation on the resistive memory cell comprises:
    providing a verifying voltage to connect across two ends of the resistive memory cell, and measuring a verifying current generated by the resistive memory cell according to the verifying voltage; and
    determining whether the verifying current is greater than a predetermined value so as to generate the verifying result of the first verifying operation,
    wherein the step of determining whether to perform the first resetting operation on the resistive memory cell according to the verifying result of the first verifying operation comprises:
    when the verifying current is not greater than the predetermined value, providing a first resetting voltage to connect across the two ends of the resistive memory cell so as to perform the first resetting operation on the resistive memory cell.

5. The setting method for the resistive memory cell of claim 1, further comprising:
    determining whether to perform a third resetting operation on the resistive memory cell according to a verifying result of the third verifying operation, and performing a fourth verifying operation on the resistive memory cell after the third resetting operation is determined to be performed and is finished; and determining whether to perform a fourth resetting operation on the resistive memory cell according to a verifying result of the fourth verifying operation.

6. The setting method for the resistive memory cell of claim 4, wherein the step of performing the second resetting operation comprises:

providing a second resetting voltage to connect across two ends of the resistive memory cell so as to perform the second resetting operation on the resistive memory cell, wherein a voltage value of the second resetting voltage is greater than a voltage value of a first resetting voltage.

7. The setting method for the resistive memory cell of claim 2, further comprising:

determining whether to perform a third resetting operation according to a verifying result of the fourth verifying operation, and performing a fifth verifying operation on the resistive memory cell after the third resetting operation is determined to be performed and is finished; and determining whether to perform a fourth resetting operation on the resistive memory cell according to a verifying result of the fifth verifying operation.

8. A resistive memory apparatus, comprising:
a plurality of resistive memory cells, coupled to a source line and a bit line;
a controller, coupled to the source line and the bit line; and
a current verifier, coupled to the bit line,
wherein the controller is configured to:
perform a first setting operation on a selected resistive memory cell, and control the current verifier to perform a first verifying operation on the selected resistive memory cell after the first setting operation is finished;
after the first verifying operation is finished, determine whether to perform a first resetting operation on the selected resistive memory cell according to a verifying result of the first verifying operation, and perform a second verifying operation on the selected resistive memory cell after the first resetting operation is determined to be performed and is finished; and
after the second verifying operation is finished, determine whether to perform a second resetting operation on the selected resistive memory cell according to a verifying result of the second verifying operation, and perform a third verifying operation on the selected resistive memory cell after the second resetting operation is determined to be performed and is finished.

9. The resistive memory apparatus of claim 8, wherein the controller determines whether to perform a second setting operation on the selected resistive memory cell according to a verifying result of the third verifying operation, and performs a fourth verifying operation on the selected resistive memory cell after the second setting operation is determined to be performed and is finished.

10. The resistive memory apparatus of claim 9, wherein the controller provides a second setting voltage to connect across two ends of the selected resistive memory cell, and performs the second setting operation on the selected resistive memory cell,
wherein a voltage value of the second setting voltage is greater than a voltage value of a first setting voltage.

11. The resistive memory apparatus of claim 8, wherein the controller provides a verifying voltage to connect across two ends of the selected resistive memory cell, and the current verifier measures a verifying current generated by the selected resistive memory cell according to the verifying voltage and determines whether the verifying current is greater than a predetermined value so as to generate the verifying result of the first verifying operation, wherein when the current verifier determines that the verifying current is not greater than the predetermined value, the controller provides a first resetting voltage to connect across the two ends of the selected resistive memory cell so as to perform the first resetting operation on the selected resistive memory cells.

12. The resistive memory apparatus of claim 8, wherein the controller is further configured to:

determine whether to perform a third resetting operation on the selected resistive memory cell according to a verifying result of the third verifying operation, and perform a fourth verifying operation on the selected resistive memory cell after the third resetting operation is determined to be performed and is finished; and determine whether to perform a fourth resetting operation on the selected resistive memory cell according to a verifying result of the fourth verifying operation.

13. The resistive memory apparatus of claim 11, wherein the controller provides a second resetting voltage to connect across two ends of the selected resistive memory cell so as to perform the second resetting operation,
wherein a voltage value of the second resetting voltage is greater than a voltage value of a first resetting voltage.

14. The resistive memory apparatus of claim 9, wherein the controller is further configured to:

determine whether to perform a third resetting operation according to a verifying result of the fourth verifying operation, and perform a fifth verifying operation on the selected resistive memory cell after the third resetting operation is determined to be performed and is finished; and determine whether to perform a fourth resetting operation on the selected resistive memory cell according to a verifying result of the fifth verifying operation.

15. A resistive memory apparatus, comprising:
a plurality of resistive memory cells, coupled to a source line and a bit line;
a controller, coupled to the source line and the bit line; and
a current verifier, coupled to the bit line,
wherein the controller is configured to:
perform a first setting operation on a selected resistive memory cell, and perform a first verifying operation on the selected resistive memory cell after the first setting operation is finished;
determine whether to perform a second setting operation on the selected resistive memory cell according to a verifying result of the first verifying operation, and perform a second verifying operation on the selected resistive memory cell after the second setting operation is determined to be performed and is finished; and
determine whether to perform a first resetting operation on the selected resistive memory cell according to a verifying result of the second verifying operation, and perform a third verifying operation on the selected resistive memory cell after the first resetting operation is determined to be performed and is finished;

determine whether to perform a second resetting operation on the selected resistive memory cell according to a verifying result of the third verifying operation, and perform a fourth verifying operation on the selected resistive memory cell after the second resetting operation is determined to be performed and is finished; and determine whether to perform a third resetting operation on the selected resistive memory cell according to a verifying result of the fourth verifying operation.

* * * * *